CRYSTAL CONTROLLED REACTANCE-TUBE OSCILLATOR CIRCUIT

Filed Oct. 26, 1953

INVENTOR.
Virgil M. Davis
BY
ATTORNEY.

United States Patent Office 2,852,747

Patented Sept. 16, 1958

2,852,747

CRYSTAL CONTROLLED REACTANCE-TUBE OSCILLATOR CIRCUIT

Virgil M. Davis, Kansas City, Kans., assignor to Midland Manufacturing Co., Inc., Kansas City, Kans.

Application October 26, 1953, Serial No. 388,223

2 Claims. (Cl. 332—28)

This invention relates to an improved type of local oscillator circuit for electronically producing a radio frequency, alternating current signal of frequency controllable within limits by the influence of an externally produced biasing voltage of magnitude corresponding to the difference between the frequency of an external reference signal and the frequency of the signal locally generated by the oscillator circuit, the frequency of the locally generated output signal of the circuit being capable of varying with the magnitude of the biasing voltage to follow and duplicate the frequency and phase of the reference signal with an improved, extreme degree of precision, stability and sensitivity of response.

The principal objects of the invention are to provide a novel circuit for attaining such improved results, for attaining such results in an improved, simple, reliable manner, and for attaining such results through the use of inexpensive, easily manufactured components. It is a particular aim of this invention to provide such a circuit for attaining such results through means including a piezoelectric crystal of a low cost, quantity production type which may have wider tolerances with respect to drifting of its resonant frequency with temperature changes, aging and the like than the types of crystals heretofore required for use in conventional circuits employed for comparable purposes.

It is an important object of this invention to provide such an improved circuit which is adapted for automatically compensating for changes in its own parameters, including changes in the resonant frequency of a piezoelectric crystal used as the primary local means of frequency control.

It is another important object of this invention to provide such a circuit which utilizes, as the primary, local means of frequency control, a piezoelectric crystal operating in a condition of low impedance characteristic of series resonance.

It is another important object of this invention to provide such a circuit, the frequency of whose output is primarily controlled by a piezoelectric crystal but secondarily controlled by the action of a reactance-tube forming a part of the oscillatory loop of the circuit, an external input, biasing voltage corresponding in magnitude to the difference between the frequency of an external reference signal and the frequency of the locally produced oscillations being coupled with the reactance tube to control the action of the latter, the series resonant frequency of the crystal approximating the frequency of the external reference signal, and the series impedance of the crystal being dependent in part on the action of the reactance tube.

It is another important object of this invention to provide such a local oscillator circuit employing a cathode follower to complete the oscillatory loop from the plate to the cathode of a cathode fed vacuum tube provided with a parallel resonant, inductance-capacitance circuit for its plate and a plate to grid feed-back path for operation of the tube as a reactance-tube, there being a piezoelectric crystal coupling the grid of the tube to ground to render the tube capable of substantially grounded-grid type amplification for sustaining oscillations in the oscillatory loop at frequencies at and slightly above the series resonant frequency of the crystal, the grid of the tube being adapted for coupling with an externally produced biasing voltage corresponding in magnitude to the difference between the frequency of an external reference signal and the frequency of the locally produced oscillations for controlling the reactance of the tube and thereby, within limits, the resonant frequency of the plate tank circuit and the frequency of oscillation of the oscillator circuit.

It is another important object of this invention to provide such a local oscillator circuit which is particularly adapted for use in the color synchronization portion of a color television receiver.

Still other objects of this invention, including important details of circuitry, will be made clear or become apparent as the following description progresses.

Figure 1:
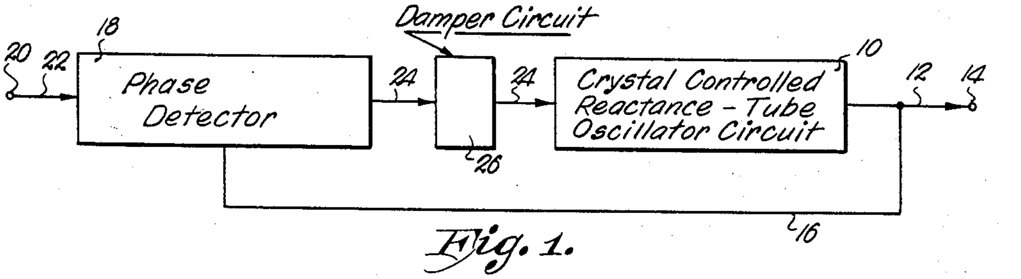
Figure 1 is a block diagram illustrating certain of the other apparatus with which the improved oscillator circuit of this invention may be conventionally combined.

Referring now to Fig. 1, the improved oscillator circuit of this invention is designated by the numeral 10. In a typical application, oscillator circuit 10 has its output coupled with an output terminal or delivery point 14 by conductive means 12 and with a conventional phase detector circuit 18 by conductive means 16. An input terminal or application point 20, which is adapted for coupling with an external source (not shown) of radio frequency, alternating current, reference frequency signal, is coupled by conductive means 22 with phase detector 18. Phase detector 18 compares the frequency and phase of the two input signal from oscillator circuit 10 and reference signal terminal 20 and produces an electrical "error signal" output corresponding in magnitude to the difference in frequency or/and phase between such input signals, such output of phase detector 18 being carried by conductive means 24 to oscillator circuit 10 and there applied as a frequency and phase controlling input in the manner to be hereinafter more fully explained. It is noted that a damper circuit 26, which may be of any conventional form such as a suitable low-pass filter network, may be provided if desired for stabilizing the equilibrium seeking action of the overall circuit by smoothing out the error signal from phase detector 18 to eliminate the "hunting" which might otherwise occur in certain applications due to abruptness of changes in the magnitude of the error signal. It will also be understood that terminals 14 and 20 and the remainder of the circuitry of Fig. 1 are electrically referred to ground (not shown).

Since both the broad combination of circuits shown in Fig. 1 and the nature and operation of phase detector circuit 18 and damper circuit 26 are conventional and well understood by those skilled in the art, this invention is directed only to the improvement of the local oscillator circuit 10 and only the latter need be here explained in detail.

In order to fully demonstrate the advantages of the present invention, however, a specific, exemplary use for circuitry as illustrated in Fig. 1 should be considered. Such an example is found in the color synchronization portion of color television receivers. Color television transmission signals are conventionally of the single side band, suppressed carrier type and include so-called "color bursts," which are periodically transmitted, synchronizing pulses modulated at a predetermined radio frequency, which is also being used for color sweeping purposes at the television camera. Current standards prescribe a modulation frequency for transmitted color bursts of between 3,579,534 and 3,579,556 cycles per second, the mean of 3,579,545 cycles per second being the preferred value.

In order for color synchronization at the receiver to be satisfactory, there must be locally generated in the receiver a radio frequency, alternating current, carrier reinsertion voltage which differs in frequency from the frequency of color sweep at the camera of the station and therefore that of the color bursts being transmitted by the station to which the receiver is tuned by not more than about one-twelfth of a cycle per second, or a phase difference of 30 degrees, performance being improved as the phase lag is decreased toward zero degrees or exact synchronization between the transmitting station and the receiver.

Attempts to provide the required color synchronization in receivers by means of fixed frequency oscillators tuned to and locally controlled at the preferred frequency of 3,579,545 cycles per second have been found impractical and unsatisfactory for a number of reasons. First, the color sweep frequencies of different transmitting stations will in normal operation vary from each other and from the preferred mean frequency to an extent preventing proper reception of some of such stations with a single, fixed, local oscillator frequency. Secondly, the color sweep frequency of a single transmitting station will, elaborate efforts to the contrary notwithstanding, in normal operation tend to drift with the passage of time to an extent that becomes critical in view of the additional drift inherent in the local oscillator of the receiver and the extremely precise requirement of synchronization of less than about 30 degrees of phase at a frequency in the neighborhood of 3.5 megacycles. Thirdly, any such local oscillator which might be designed for an absolute stability of the order of plus or minus 30 degrees of phase from a single radio frequency in the 3.5 megacycle range would be prohibitively expensive to incorporate in television receivers and, regardless of design, would still be subject to a certain amount of drift caused by factors well known to those skilled in the art and which, when cumulated with the drift inherent in the color sweep frequency of a transmitting station, would make consistent synchronization with the desired degree of precision impossible.

Accordingly, the color burst system of including in the intelligence carried by the transmitted signal for reception at the receiver synchronizing pulses originating at the transmitting station and adapted for utilization at the receiver by a circuit substantially as indicated in Fig. 1 for providing a secondary means of control over, or correction to, the frequency of a locally generated carrier reinsertion signal was necessarily adopted. It may be noted that the primary or basic frequency control over the local oscillators 10 used in such applications is, because of the high degree of stability required, necessarily furnished by a piezoelectric crystal. It is also most signficant that, for the same reason, only those cuts of crystal having certain inherent frequency drift characteristics with aging and under conditions of varying temperature can be used in conventional local oscillators 10, and moreover, that even with otherwise satisfactory types of crystal cut, only those individual crystals whose manufacture has been carried out within very close tolerances particularly as to the exact angle of cut, can be used.

The last-mentioned factors seriously curtail production and, therefore, greatly increase manufacturing costs. In manufacturing piezoelectric crystals, an attempt is made to cut each individual blank from the mother crystal at that particular angle from the axes of the mother crystal which will give optimum stability. With available methods of cutting crystals, however, a substantial number of blanks are always found to have been cut at an angle more or less outside the tolerance limits for optimum stability. Heretofore, those blanks even slightly outside an optimum range of tolerances had to be discarded, thereby raising costs and limiting availability of satisfactory crystals. These are the main problems that the present invention overcomes by providing improved circuitry for the local oscillator 10, permitting improved performance of the oscillator circuit 10 even with the employment of piezoelectric crystals of less stability than those heretofore required with conventional circuits 10.

Figures 2, 3:
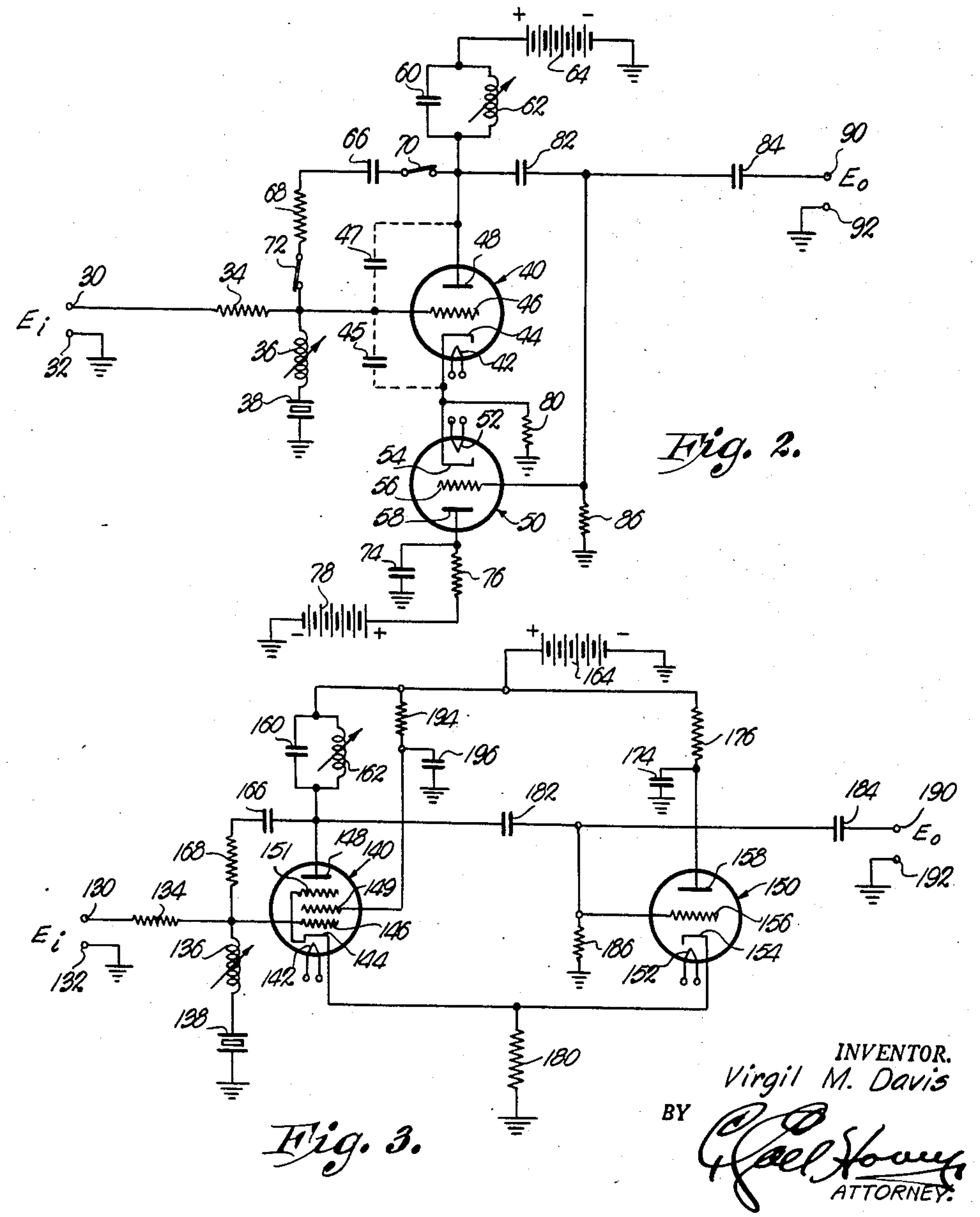
Fig. 2 is a schematic diagram of one embodiment of the oscillator circuit of this invention, the component-representing symbols being arranged to facilitate explanation.
Fig. 3 is a schematic diagram of another, preferred embodiment of the oscillator circuit of this invention, which is particularly adapted for use in color television, synchronization applications.

Referring now to Fig. 2, input terminals 30 and 32 are adapted for coupling with the output of a phase detector such as indicated at 18 in Fig. 1, terminal 32 being grounded. It may be noted that the output of phase detector 18 is normally and preferably a negative, direct current voltage which varies in either direction about a predetermined negative value chosen for biasing purposes, as will hereinafter be made apparent, such predetermined value corresponding to zero "error" or equality of the two input signals applied to phase detector 18. However, it will be understood by those skiled in the art, that such end could obviously be accomplished in various ways where the oscillator circuit 10 is used in conjunction with an error signal input which varies about ground potential rather than a predetermined negative potential, as by the provision of a separate negative biasing source (not shown) coupled with terminal 30.

Terminal 30 is coupled by a series resistor 34 with the grid 46 of a triode vacuum tube 40, which may be any suitable triode tube or one section of a type 12AT7 dual triode tube. Tube 40 is also provided with a filament 42 adapted for coupling with a source of filament power (not shown) in conventional manner, a cathode 44, and a plate 48. A second triode tube 50, which may comprise the other section of a type 12AT7 dual triode, is provided and has a filament 52 adapted for being heated by any suitable source of filament power (not shown), a cathode 54, a grid 56, and a plate 58.

Grid 46 of tube 40 is coupled with ground through a preferably variable inductance 36 and thence a piezoelectric crystal 38. Crystal 38 preferably will have a mean series resonant frequency closely approximating that of the desired output. It will be observed that, at the series resonant frequency of crystal 38, its impedance will be sufficiently low to render any amplifying action of the tube 40 at such frequency substantially a grounded grid type of operation. For a circuit 10 for use in the color synchronization portion of a color television receiver made to operate in accordance with currently prevailing standards, the crystal 38 is preferably an AT-cut, quartz crystal with a series resonant frequency approximating 3,579,545 cycles per second, other cuts of quartz or crystals of other material being preferable for certain other frequencies as will be clear to those skilled in the art.

Plate 48 of tube 40 is coupled through a preferably tunable, parallel resonant, tank circuit, comprised of a capacitor 60 in parallel with a variable inductance 62, to a suitable source of positive, direct current, plate potential, such as a battery 64 having its negative terminal grounded. It will be obvious that capacitor 60 could be made variable instead of inductance 62, and also that power source 64 may take conventional forms other than that of a battery.

A feed-back path is provided from plate 48 to grid 46 of tube 40 by a blocking capacitor 66 and a resistance 68, a switch 70 being inserted in Fig. 2 between capacitor 66 and plate 48 and a switch 72 being inserted in Fig. 2 between resistance 68 and grid 46 merely for illustrative purposes for use in connection with the explanation of operation hereinafter set forth. In Fig. 2, for the same reason, the inherent, internal, interelectrode capacitance between the cathode 44 and the grid 46 of tube 40 is represented by a virtual capacitor 45 and the dotted-line, virtual couplings associated therewith, and the interelectrode capacitance between the plate 48 and the grid 46 of tube 40 is represented by a virtual capacitance 47 and the dotted-line, virtual couplings associated therewith.

Plate 58 of tube 50 is bypassed to ground through a capacitor 74 and is coupled through a current limiting resistance 76 to a suitable source of positive plate potential, such as a battery 78 having its negative terminal grounded. Obviously, in practice, sources 64 and 78 may be one and the same, although in Fig. 2 they are illustrated as separate to facilitate explanation of operation.

Cathodes 44 and 54 of tubes 40 and 50 are coupled together and are both coupled to ground through a common cathode resistance 80, it being noted that tube 50 is therefore coupled as a cathode follower in cathode feeding relationship to tube 40.

Plate 48 of tube 40, and consequently a portion of the output of the latter, are coupled through a capacitor 82 with the grid 56 of tube 50 to complete the oscillatory loop of the circuit 10, such portion of the output from plate 48 of the tube 40 being fed to grid 56 of tube 50 and the output from cathode 54 of tube 50 being fed to cathode 44 of tube 40. The useable output of oscillator circuit 10 is carried from plate 48 of tube 40 through capacitor 82 and another capacitor 84 to the first of a pair of output terminals 90 and 92, the other output terminal being grounded and numbered 92. A grid-leak resistance 86 is provided for 50 and couples grid 56 ground.

It is believed that the operation of circuit 10 will best be understood if explanation is first made of the manner in which the circuit would operate if the hypothetical switches 70 and 72 were opened to remove the feed-back loop of tube 40 which normally couples a portion of the signal on plate 48 back to the grid 46. Assuming, therefore, the capacitor 66 and resistance 68 have been removed from the circuit 10 in such manner for purposes of illustration, it will be seen that oscillation can be sustained in the circuit 10 only when the amplification or gain through tube 40 exceeds unity by an amount sufficient to overcome the loss of amplitude inherent in the cathode follower circuitry of tube 50 and other incidental losses inherent in the components used.

It will be recalled that a negative bias is applied to grid 46 of tube 40 by means of the reference voltage coupled with input terminals 30 and 32. The magnitude of such negative bias applied to grid 46 under conditions of a zero error signal, that is, when the frequencies of the signals being applied to the phase detector 18 by conductive means 16 and 22 in Fig. 1 are equal, is that negative voltage between ground potential and the cut-off value for tube 40 which is at or approximately the midrange of the band of possible oscillation for the particular crystal 38 being used in the circuit. In other words, the natural, series resonant frequency of crystal 38 is chosen as one slightly lower than the desired output frequency of oscillator circuit 10, and the "zero error" bias upon grid 46 is established at a value which sustains oscillations in the circuit 10 at precisely the desired output frequency.

With the negative bias applied to grid 46 but no error signal applied thereto, the first adjustment is to tune the variable inductance 62 of the parallel, resonant plate tank circuit 60–62 of tube 40 to resonance at the desired output frequency of circuit 10. The attainment of such condition can be determined when the grid current of tube 50 is maximized, which measurement is made by tuning for maximum voltage across grid leak resistance 86.

Next, inductance 36 is adjusted to place the output of circuit 10 at precisely the desired frequency. As above pointed out, the natural resonant frequency of crystal 38 is slightly below such desired output frequency and adjustment of inductance 36 accordingly displaces the effective resonance of crystal 38 and inductance 36 to a frequency slightly above the natural series resonant frequency of crystal 38 and within the zone of inductive reactance of the latter wherein the impedance presented between grid 46 and ground is sufficiently low to sustain oscillations in the circuit 10. The last mentioned measurement is, of course, one of frequency to be made in conventional manner relative to the output of circuit 10 as presented at terminals 90 and 92.

In this condition, with capacitance 66 and resistance 68 hypothetically removed from the circuit, the impedance between grid 46 and ground is sufficiently low at the series resonant frequency of crystal 38 and frequencies slightly higher that tube 40 may operate as grounded grid amplifier with sufficient gain to overcome the loss of the cathode follower 50 and other incidental losses, whereby oscillations are sustained in the oscillatory loop from plate 48 of tube 40 through coupling capacitor 82 to grid 56 of tube 50 and thence from cathode 54 of tube 50 to cathode 44 of tube 40. Outside the narrow limits of frequency wherein such low impedance condition of crystal 38 exists, crystal 38 quickly becomes a substantially higher impedance which decreases the gain of tube 40 to a point where oscillations will not be sustained. The latter effect will be understood by those skilled in the art to occur because of inverse feed-back introduced into the circuitry associated with tube 40 through the effects of the inner electrode capacitance of tube 40 as represented in Fig. 2 by capacitors 45 and 47. This will be more clear when it is appreciated that any voltage developed between grid 46 and ground will give rise to inverse, back voltages developed by interelectrode capacitances 45 and 47.

It is significant that the parallel resonant, plate tank circuit 60—62 of tube 40 must be resonant to the same frequency as the effective series resonant frequency of crystal 38 and inductance 36, in order for a high impedance to be presented in the plate circuit of tube 40 across which maximum voltage may be developed for feeding back around the oscillatory circuit to the grid 56 of tube 50. When the resonant frequency of the parallel resonant circuit 60—62 is different from the effective series resonant frequency of crystal 38 and inductance 36, the impedance of the latter is altered to present a different amount of inter-electrode feed-back through tube 40, and the circuit 10 will oscillate at a slightly different frequency determined by such new impedance.

Consider now the case when switches 70 and 72 are closed to place the feed-back loop 66—68 for tube 40 into the circuit. Tube 40 now acts as a reactance tube injecting into the circuit an effective capacity between plate 48 of tube 40 and ground. Since such injected capacity between plate 48 and ground is effectively parallel to tuned circuit 60—62, it is clear that the frequency at which the latter resonates will be changed.

It is significant that the magnitude of the capacity injected by tube 40 in such condition is a function of the transconductance of tube 40, such capacity increasing as the transconductance of tube 40 is increased. Since the transconductance of tube 40 may be varied by changing the negative direct current biasing potential applied to the grid 46, it is clear that the amount of capacity injected in the circuit by the reactance tube action of tube 40, and accordingly the resonant frequency of tuned circuit 60—62, the effective impedance of crystal 38 and inductance 36 and the frequency of the oscillations in the circuit 10, may and will be varied with changes in the negative potential applied to grid 46 of tube 40.

The complete circuit 10 presents, therefore, a local oscillator with combined frequency control by the piezoelectric crystal 38 and, within that range of frequencies slightly greater than the natural series resonant frequency of crystal 38 wherein the impedance of the latter is both low and inductive, by the reactance tube action of tube 40 responsive to changes in the magnitude of a negative, direct current biasing potential applied to grid 46 of tube 40 from terminal 30. Accordingly, with a fixed value of bias applied to grid 46 the resonant frequency of the tuned circuit 60—62 is established and the frequency of oscillation in circuit 10 determined thereby. However, as the magnitude of the negative bias applied to grid 46 is changed in either direction, the resonant frequency to which the plate tank circuit 60—62 is tuned is changed by virtue of the different amount of capacity injected in parallel with such tuned circuit 60—62 by the reactance tube action of tube 40, which change of resonant frequency of tuned circuit 60—62 in turn changes the effective impedance of crystal 38 and inductance 36 to establish a new oscillating frequency for the circuit 10.

Such adaptability to change in oscillating frequency of the circuit 10 with changes in the biasing potential of grid 46 of tube 40 may obviously be used for synchronizing the output frequency of circuit 10 to follow and duplicate the frequency of a refrence signal compared with the output of oscillator circuit 10 by a phase detector 18 in the manner indicated in Fig. 1 and above described.

The preferred circuit illustrated in Fig. 3 is electrically, substantially identical to the circuit shown in Fig. 2 except that in place of the triode tube 40 used in Fig. 2 a pentode type tube 140 is used. Since the amount of change in oscillating frequency of the circuit 10 produced by a given change in the negative biasing voltage is greater with a pentode than a triode, it is apparent that the use of pentode tube 140 in the circuit of Fig. 3 increases the sensitivity and overall response of the circuit 10. The various components appearing in Fig. 3 are numbered with numerals greater than their counterparts in Fig. 2 by 100, the only parts shown in Fig. 3 and not in Fig. 2 being the screen grid 149 and the suppressor grid 151 forming a part of the pentode tube 140 and a current limiting resistor 194 coupling screen grid 149 with high voltage source 164 and a bypass capacitor 196 between screen grid 149 and ground. It may be noted that the type 6U8 combined triode-pentode tube has been found ideally suited for use in the circuit in Fig. 3, the pentode section of such tube being used as tube 140 and the triode section of such tube being used as tube 150.

It will now be apparent that a new and improved type of oscillator circuit having many advantages over the conventional forms of circuits heretofore used is presented by this invention. Obviously, many minor changes, modifications and substitutions of equivalents could be made in the circuit 10 without departing from the spirit of this invention. Accordingly, it is intended that this invention shall be limtied only by the scope of the appended claims.

Having thus described the invention, what is claimed as new and desired to be secured by Letters Patent is:

1. A crystal controlled, reactance-tube oscillator circuit adapted for selectively generating an alternating current output of any frequency and phase within a frequency-phase band of predetermined width including one certain preselected frequency and phase and frequencies and phases greater than said one preselected frequency, said oscillator circuit including a first vacuum tube structure having a cathode, a grid and a plate; an inductance-capacitance circuit having parallel resonance properties at a frequency and phase within said band; a piezoelectric crystal having series resonance properties at said one perselected frequency; means, including said inductance-capacitance circuit, coupling said plate with ground; means, including a resistance, coupling said cathode with ground; means, including said crystal, coupling said grid with ground; means adapted for coupling said grid with a source of negative biasing potential of selectively variable level less than the cutoff value for said tube structure and adapted for providing, within its range of variation, greater than unity voltage amplification in said tube structure between said cathode and said plate thereof; means coupling said plate with said cathode externally of said tube structure to present a feed-back circuit for a portion of the output of said plate; and a resistance-capacitance circuit coupling said plate with said grid, to present a feed-back loop for a portion of the output of said plate, whereby to render said tube structure operable as a reactance tube for which the frequency and phase at which oscillations will be sustained in said oscillator circuit are determined in accordance with the level of said biasing potential to which said grid is coupled.

2. In the oscillator circuit as set forth in claim 1, wherein said feed-back circuit includes a cathode follower circuit including a second vacuum tube structure provided with a cathode, a grid and a plate and having its grid coupled with the plate of said first tube structure and its cathode coupled with the cathode of said first tube structure, and said voltage amplification in said first tube structure between said cathode and said plate thereof exceeds the sum of all electrical losses in said feed-back circuit by an amount greater than unity at a frequency and phase within said band corresponding to the level of said electrical potential to which said grid is coupled.

References Cited in the file of this patent

UNITED STATES PATENTS

| | | |
|---|---|---|
| 1,953,140 | Trouant | Apr. 3, 1934 |
| 2,298,774 | Parker | Oct. 13, 1942 |
| 2,350,171 | Lawrence | May 30, 1944 |
| 2,361,731 | Bach | Oct. 31, 1944 |
| 2,369,954 | Downey | Feb. 20, 1945 |
| 2,426,295 | Born | Aug. 26, 1947 |
| 2,682,767 | Henry | July 6, 1954 |
| 2,740,891 | Bowser | Apr. 3, 1956 |